(12) United States Patent
Downing

(10) Patent No.: US 12,345,903 B2
(45) Date of Patent: Jul. 1, 2025

(54) PHOTO RESIST AS OPAQUE APERTURE MASK ON MULTISPECTRAL FILTER ARRAYS

(71) Applicant: MATERION CORPORATION, Mayfield Heights, OH (US)

(72) Inventor: Kevin R. Downing, Westford, MA (US)

(73) Assignee: Materion Corporation, Mayfield Heights, OH (US)

( * ) Notice: Subject to any disclaimer, the term of this patent is extended or adjusted under 35 U.S.C. 154(b) by 60 days.

(21) Appl. No.: 18/366,081

(22) Filed: Aug. 7, 2023

(65) Prior Publication Data

US 2023/0375761 A1 Nov. 23, 2023

Related U.S. Application Data

(60) Continuation of application No. 17/584,837, filed on Jan. 26, 2022, now Pat. No. 11,762,137, which is a
(Continued)

(51) Int. Cl.
*G02B 5/20* (2006.01)
*G03F 7/00* (2006.01)
(Continued)

(52) U.S. Cl.
CPC ........... *G02B 5/201* (2013.01); *G03F 7/0015* (2013.01); *G03F 7/0382* (2013.01); *G03F 7/0392* (2013.01); *G03F 7/70308* (2013.01)

(58) Field of Classification Search
CPC . G02B 5/201; G02B 1/00; G02B 1/04; G02B 1/10; G02B 5/003; G02B 5/20;
(Continued)

(56) References Cited

U.S. PATENT DOCUMENTS 7,005,216 B2 2/2006 Shiraishi
8,034,517 B2 10/2011 Tsao
(Continued)

FOREIGN PATENT DOCUMENTS

JP S57-192505 5/1981
JP S56-150703 11/1981
(Continued)

OTHER PUBLICATIONS

Intl. Search report for PCT/US2018/050678 dated Dec. 11, 2018.
(Continued)

*Primary Examiner* — Arnel C Lavarias
(74) *Attorney, Agent, or Firm* — COZEN O'CONNOR

(57) ABSTRACT

An apparatus (e.g., a multi-spectral optical filter array, an optical wafer, an optical component) has an aperture mask printed directly thereon, the aperture mask including a positive or negative photoresist. The apparatus includes a substrate having the aperture mask printed on at least one of a light entrance surface or a light exit surface of the substrate so as to provide an aperture over a portion of the substrate. The photoresist from which the aperture mask is formed is photo-definable or non-photo-definable, and is deposited/printed to form the aperture mask on the substrate.

18 Claims, 3 Drawing Sheets

Related U.S. Application Data division of application No. 16/129,309, filed on Sep. 12, 2018, now Pat. No. 11,269,120.

(60) Provisional application No. 62/557,909, filed on Sep. 13, 2017.

(51) Int. Cl.
*G03F 7/038* (2006.01)
*G03F 7/039* (2006.01)

(58) Field of Classification Search
CPC . G02B 5/22; G02B 5/223; G02B 5/28; G02B 5/285; G03F 7/0015; G03F 7/0382; G03F 7/0392; G03F 7/70308; G03F 7/70283
USPC ....... 359/614, 601, 609, 577, 580, 738, 739, 359/740, 885; 257/98, 435
See application file for complete search history.

(56) References Cited

U.S. PATENT DOCUMENTS

| | | | |
|---|---|---|---|
| 9,904,097 | B2 | 2/2018 | Li |
| 10,197,806 | B2 | 2/2019 | Negrete |
| 10,249,771 | B2 | 4/2019 | Wang |
| 11,269,120 | B2 | 3/2022 | Downing |
| 11,762,137 | B2 * | 9/2023 | Downing .............. G03F 7/0392 430/6 |
| 2002/0058212 | A1 | 5/2002 | Toshihiko et al. |
| 2002/0052122 | A1 | 6/2002 | Hasegawa et al. |
| 2002/0081501 | A1 | 6/2002 | Hasegawa et al. |
| 2006/0274230 | A1 | 12/2006 | Shao |
| 2006/0284956 | A1 | 12/2006 | Chou |
| 2012/0268700 | A1 | 10/2012 | Shu et al. |
| 2013/0070187 | A1 | 3/2013 | Hsiao |
| 2014/0307309 | A1 | 10/2014 | Downing et al. |
| 2015/0362840 | A1 | 12/2015 | Feng et al. |
| 2016/0320663 | A1 | 11/2016 | Hao et al. |
| 2016/0342082 | A1 | 11/2016 | Fu |
| 2017/0010529 | A1 | 1/2017 | Aoyagi |
| 2017/0173628 | A1 | 6/2017 | Downing |
| 2018/0088458 | A1 | 3/2018 | Shen |

FOREIGN PATENT DOCUMENTS

| | | |
|---|---|---|
| JP | 2002-162517 | 6/2002 |
| JP | 2004101868 | 4/2004 |
| JP | 2004-246094 | 9/2004 |
| JP | 2005-156343 | 6/2005 |
| JP | 2011-510285 | 3/2011 |
| WO | 2012066741 | 5/2012 |

OTHER PUBLICATIONS

"PHOTORESIST", retrieved from Wikipedia, Feb. 16, 2021.
Microfilm of Japanese Utility model appl. No. 56-080181 (JP laid open utility model pub No. 57-192505) Translator's note: no English Language counterpart could be located, May 30, 1956.
English translation of Official Action dated Jul. 21, 2022; 5 pages; JP Patent Application No. 2020-515012.
Japanese Office Action dated Jul. 15, 2022 for Application Serial No. 2020-515012 (8 pages).
Japanese Office Action dated Oct. 28, 2022 for Application Serial No. 2020-515012 (12 pages).
Japanese Search Report dated Jun. 28, 2022 for Application Serial No. 2020-515012 (25 pages).
International Preliminary Report on Patentability dated Mar. 17, 2020 for Application Serial No. PCT/US2018/050678 (8 pages).

* cited by examiner

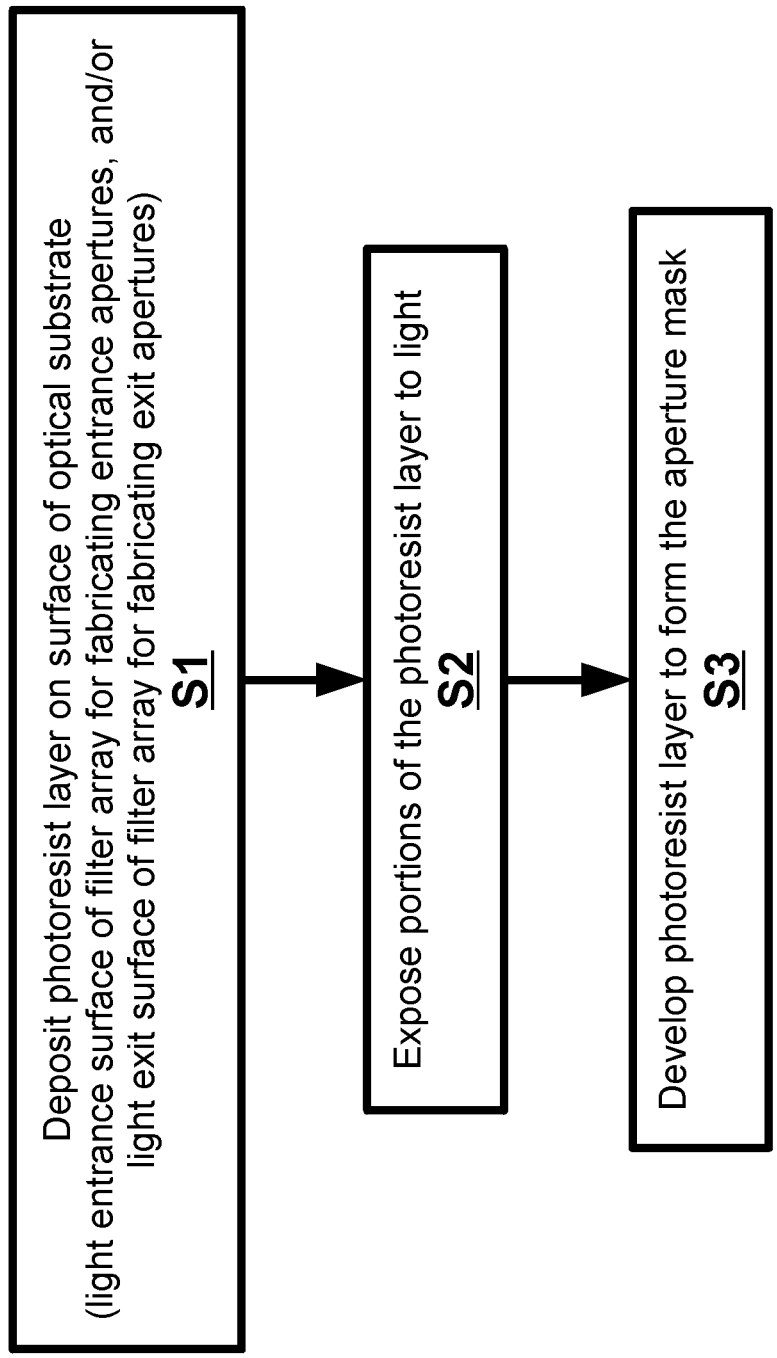

PHOTO RESIST AS OPAQUE APERTURE MASK ON MULTISPECTRAL FILTER ARRAYS

This application is a continuation application of U.S. Non-Provisional application Ser. No. 17/584,837 filed Jan. 26, 2022, which is a divisional application of U.S. U.S. Pat. No. 11,269,120 filed Sep. 12, 2018, which claims the benefit of U.S. Provisional Application No. 62/557,909 filed Sep. 13, 2017, all of which are incorporated herein by reference in their entireties.

BACKGROUND

The present disclosure relates to the optical arts, optical filter arts, spectrographic arts, and related arts.

Optical filters with high spectral selectivity can be manufactured using a stack of layers, with alternating layers of two (or more) constituent materials having different refractive index values. Such filters are sometimes called interference filters, and can be designed to provide a designed pass-band, stop-band, high-pass, or low-pass output. For pass-band filters, the width of the pass band can typically be made as narrow as desired by using more layer periods in the stack, albeit possibly with some transmission loss at the peak transmission wavelength. A notch filter can be similarly designed by constructing the stack of layers to form a Bragg reflector blocking the stop band. The layer stack is deposited on a substrate that is optically transmissive for the wavelength or wavelength range to be transmitted, and may for example be a glass plate for an optical filter operating in the visible spectrum. This results in a filter plate whose structural rigidity is provided by the substrate.

In such optical filters, a given filter plate operates at a single well defined pass band or stop band. The layers of the stack are typically required to have precise thicknesses to meet the specified wavelength and bandwidth for the pass band or stop band.

However, it is difficult or impossible to vary the layer thicknesses across the substrate plate during layer deposition or by post deposition processing in a controlled manner in order to provide different pass bands or stop bands in different areas of the plate. Such an arrangement is useful for a spectrometer, spectrum analyzer, or other "multi spectral" applications.

Filter arrays address this problem by fabricating a set of filter plates with different filter characteristics (e.g. different pass band or stop band wavelength and/or bandwidth). The filter plates are then diced to form filter elements in the form of strips. These strips are then bonded together in a desired pattern to form the filter array. The resulting filter array is sometimes referred to as a "butcher block" due to its similarity in bonding structural elements (filter elements here, c.f. wood elements in the case of an actual butcher block). This approach decouples the optical characteristics of each filter element of the filter array from those of the other filter elements, enabling substantially any combination of filter elements in a single filter array.

In the optical arts, if an image to be viewed is too bright, stray light can cause areas of bright light to bleed into adjoining dark areas and blur or eliminate the border between the bright and dark areas. This can be particularly problematic when two bright areas are separated by a narrow dark area, because the irradiation can effectively cause the separating dark area to disappear. This can result in too much glare existing for any significant detail to be seen.

To alleviate the aforementioned problems, aperture masks are often used. A mask, which is often a dark color, is placed over the filter array, with the mask containing apertures therein. If properly constructed and positioned, the aperture mask greatly reduces brightness and glare, reduces irradiation, and eradicates diffraction effects, thereby improving contrast and avoiding undesirable bleeding of bright areas into dark areas. Generally, an aperture mask works by reducing the resolution of a large scope down to the resolution of an unobstructed refractor having the same size as the aperture in the aperture mask. Often, however, it can be desirable to have a sharp, steady image with reduced resolution instead of a bright image lacking any details. The use of an aperture mask provides this desired sharp, steady image with a large scope.

Conventionally, aperture masks are deposited in a similar fashion to optical coatings themselves. A first layer is deposited onto an optical coating. A chemical compound is then applied to the first layer in a design corresponding to the desired aperture. This forms a mask on the first layer, masking away those portions that are to remain. An etching compound is then applied, which removes the non-masked portions of the first layer. The chemical compound is then removed via application of a suitable chemical, leaving the aperture mask formed from the first layer. This process requires the use of optical Dark Mirror Coating (DMC) coatings upon which the aperture mask is printed, and further requires certain conditions, such as temperature and stress as well as a long lift-off process for the chemicals.

It would therefore be desirable to provide aperture masks that eliminate the need for optical DMC coatings and eliminate certain conditions required for coatings, such as temperature and stress as well as the long lift-off process in chemicals. Some improved aperture masks are disclosed herein.

BRIEF DESCRIPTION

The present disclosure relates to methods and apparatuses (e.g., a multi-spectral optical filter array, an optical wafer, an optical component) having aperture masks deposited/printed thereon.

Disclosed in various embodiments are apparatuses comprising a substrate having an aperture mask printed on at least one of a light entrance surface or a light exit surface of the substrate so as to provide an aperture over a portion of the substrate. The aperture mask includes a photoresist, or in other words is formed from the photoresist.

The photoresist may be opaque. In particular embodiments, the substrate does not include an optical coating between the aperture mask and the at least one of light entrance surface or the light exit surface to which the aperture mask is printed. The aperture mask can be printed on both the light entrance surface and the light exit surface of the substrate.

The film-coated substrate can be a multi-spectral optical filter array, an optical wafer, or another optical component.

The photoresist can be positive or negative, and can be photo-definable or non-photo-definable.

Methods are also disclosed, the methods comprising providing a film-coated substrate, printing an aperture mask on an optical coating on at least one of a top or a bottom of the film-coated substrate so as to provide an aperture over a portion of the substrate, and depositing a photoresist, the photoresist printed to form the aperture mask on the substrate.

The method can further comprise curing (e.g., via an ultraviolet lamp) the deposited photoresist on the substrate, thereby forming the aperture mask thereon.

Also disclosed herein are multi-spectral optical filter arrays having a filter element substrate with an opaque aperture mask printed thereon, the aperture mask being formed from a photoresist.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

FIG. 3 diagrammatically show a method of manufacturing the filter array.

DETAILED DESCRIPTION

Figure 1:
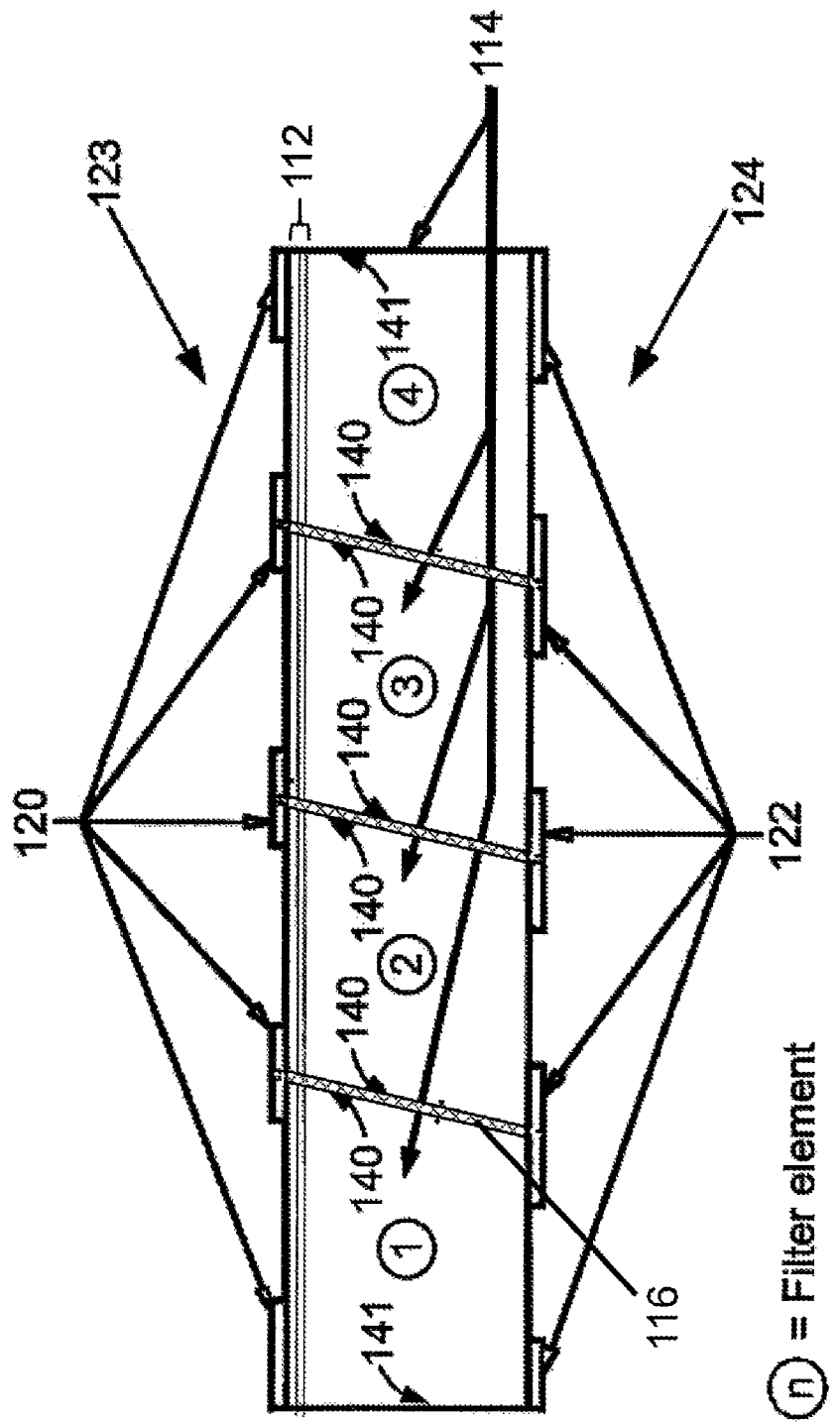
FIG. 1 diagrammatically show a side view of a first exemplary filter array having an aperture mask that includes or is formed from a photoresist, which can be printed thereon.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent can be used in practice or testing of the present disclosure. All publications, patent applications, patents, and other references mentioned herein are incorporated by reference in their entirety. The materials, methods, and articles disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any unavoidable impurities that might result therefrom, and excludes other ingredients/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "about" and "approximately" can be used to include any numerical value that can vary without changing the basic function of that value. When used with a range, "about" and "approximately" also disclose the range defined by the absolute values of the two endpoints, e.g. "about 2 to about 4" also discloses the range "from 2 to 4." Generally, the terms "about" and "approximately" may refer to plus or minus 10% of the indicated number.

The present disclosure may refer to temperatures for certain process steps. It is noted that these generally refer to the temperature at which the heat source (i.e., furnace, oven, etc.) is set, and do not necessarily refer to the temperature that must be attained by the material being exposed to the heat.

The term "room temperature" as used herein refers to a temperature in the range of 20° C. to 25° C.

It is noted that the coefficient of thermal expansion is typically reported as the average between a starting temperature and a reported temperature.

It is further noted that as used herein, "aperture mask," "mask," and "opaque coating" may be used interchangeably, unless understood by the context in which they are used below to refer to distinct embodiments. For example, an "aperture mask" may comprise other coatings besides "opaque", and the use herein is intended solely to assist the reader and not to limit application of the subject disclosure to only aperture masks of opaque coating materials.

As explained in greater detail below, the present disclosure provides exemplary embodiments of methods and apparatuses including the application of an opaque aperture mask that includes or is formed from a photoresist on a variety of optical components (e.g., filter arrays). According to several embodiments set forth herein, the application may be performed on one or both faces of the filter creating an aperture mask on the entrance and/or the exit face. It will be appreciated that the non-limiting examples of the present disclosure describe and illustrate embodiments wherein the aperture mask may be offset from the entrance face and/or the exit face, taking into account the incident angle of a light ray.

Figure 2:
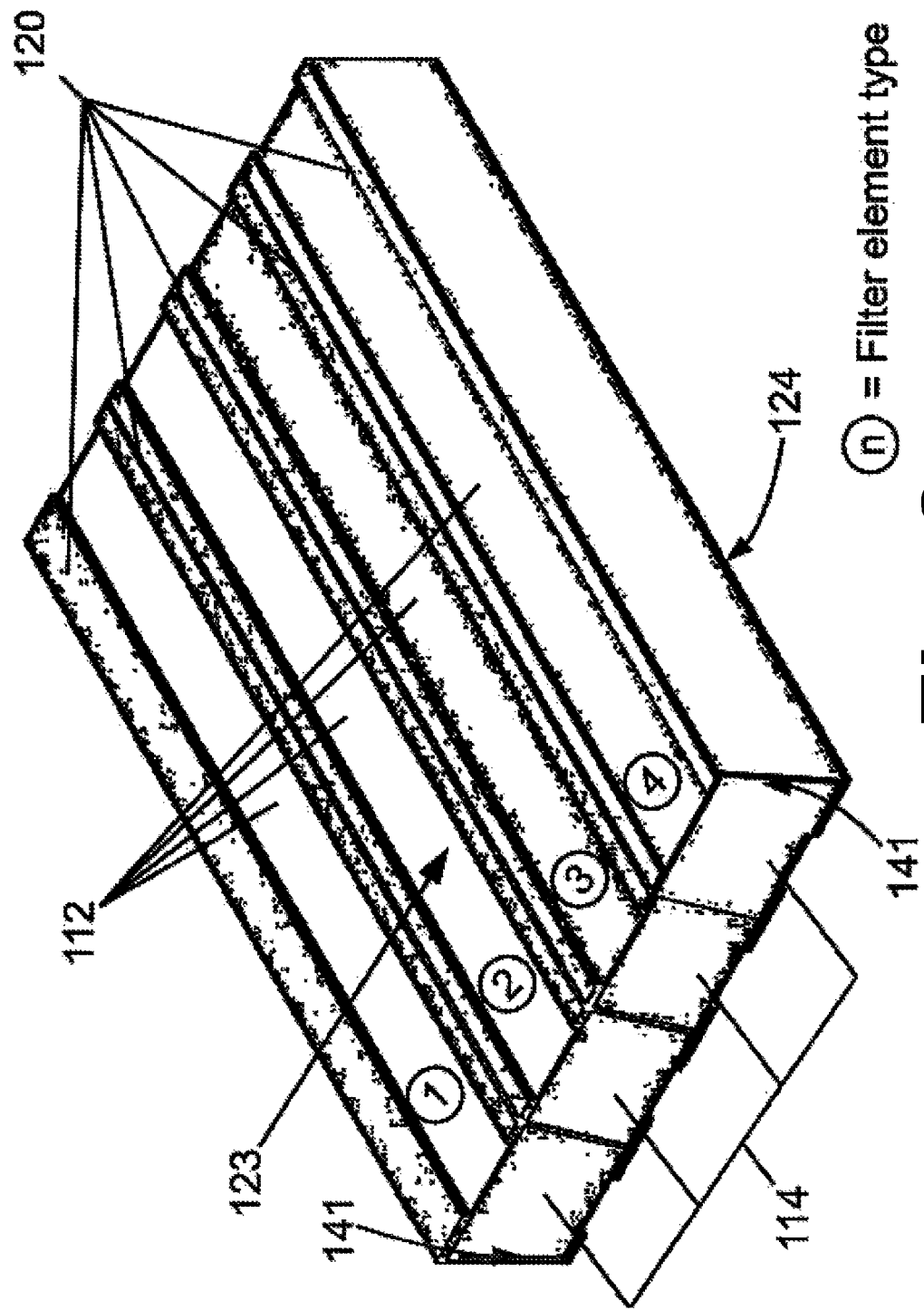
FIG. 2 diagrammatically show a perspective view of the filter array of FIG. 1.

As shown in FIG. 1, a preexisting or prefabricated optical filter array (i.e., the substrate) is provided. The substrate is, in particular illustrative embodiments, a multi-spectral optical filter array. The substrate may comprise an optical wafer. The substrate of FIG. 1 corresponds to an angled array. The perspective view of FIG. 2 shows the "stick" geometry of the optical filter elements of this one-dimensional filter array. As seen in both FIG. 1 and FIG. 2, the filter elements have slanted sidewalls 140 (labeled only in FIG. 1). However, the outermost optical filter elements of the filter array (those identified with numbers "1" and "4") have straight "outer" sidewalls 141 forming the edges of the assembled filter array. This can be advantageous insofar as the assembled filter array has the shape of a right-angled parallelepiped. An alternative (not shown) is to employ optical filter elements with both sidewalls slanted, and to include additional triangular-shaped fill elements to provide the assembled filter geometry with straight outermost sidewalls. The filter array depicted in FIG. 1 is shown as being an angled filter array. However, the substrates/filter arrays of the present disclosure can generally be of any desired structure and are only limited by the apertures masks which are applied thereon.

With reference to FIG. 1, an improved filter array is shown in side-sectional view. In this diagrammatic illustrative example, a filter array includes four filter elements labeled "1" to "4". (This is merely illustrative—in general the filter array may have dozens or hundreds of filter elements). Each filter element is diced from a filter plate on which a filter layers stack was deposited having a different optical characteristic (e.g., different pass band or stop band, in terms of center wavelength and/or bandwidth). As shown in FIG. 1, each filter element can thus include a filter layers stack 112 supported by a filter element substrate 114. The filter layers stack 112 is, for example, embodied as multiple layers of optical coatings forming interference filters, disposed on the filter element substrate 114.

Typically, each filter element is diced from a single filter plate. The filter elements may, in general, be designed for any pass band or stop band in the ultraviolet, visible, or infrared wavelength range. By way of illustrative example, a filter element operating in the visible range may include a filter element substrate 114 of glass, sapphire, or another material having suitable transparency in the optical range, and the filter stack 112 may include alternating layers of tantalum oxide ($Ta_2O_5$) and silicon dioxide ($SiO_2$), or more generally alternating layers of two (or more) materials with different refractive index values. By way of another illustrative example, the layers may be metal/metal oxide layers such as titanium/titanium dioxide ($Ti/TiO_2$). Known techniques for designing interference filter optical stacks can be employed to design the layer thicknesses for a given passband or notch filter stop-band, or to provide desired high pass or low pass filtering characteristics. The diced filter elements are bonded together using an adhesive or other bond 116. The bonded optical filter elements may comprise a plurality of optical filter elements defined by different interference filters. The interference filters of the optical filter elements may comprise pass-band filters or notch filters operating in (in various embodiments) the visible spectrum, the ultraviolet spectrum, and/or the infrared spectrum.

With continuing reference to FIG. 1, the illustrative filter array is designed to be illuminated by light. Again, the filter array depicted in FIG. 1 is shown as being an angled filter array, such that the light would enter the array at an angle. As explained above, as will be appreciated by those skilled in the art, the substrates/filter arrays of the present disclosure can generally be of any desired structure and are only limited by the apertures masks which are applied thereon.

In use, light impinges on a light entrance surface 123 of the filter array. Printed on the light entrance surface 123 of the filter array are entrance apertures 120. The entrance apertures 120 define an aperture mask on the light entrance surface 123 of the filter array. In accordance with the present disclosure, the aperture mask defined by the entrance apertures 120 includes a photoresist, with the apertures applied at predetermined locations on the array. The entrance apertures 120 reduce optical cross-talk (e.g. block stray light) at the light entrance surface 123 of the filter array.

The light then passes through the filter layers stack 112 of the filter element and through the filter element substrate 114, and exits from a light exit surface 124 of the filter array. Printed on the light exit surface 124 are exit apertures 122. The exit apertures 122 define an aperture mask on the light exit surface 124 of the filter array. In accordance with the present disclosure, the aperture mask defined by the exit apertures 122 includes a photoresist, with the apertures applied at predetermined locations on the array. The exit apertures 122 reduce optical cross-talk (e.g. block stray light) at the light exit surface 124 of the filter array.

The light output from the light exit surface of each filter element is filtered by the filter layers stack 112 of that filter element, and thus includes only the spectral component of the incident light in the pass-band (or only the spectral component outside of the stop-band, in the case of a notch filter; or only the spectral component above the cut-off wavelength in the case of a high-pass filter element; or only the spectral component below the cut-off wavelength in the case of a low-pass filter element; or so forth). In FIG. 1, the filter layers stack 112 of each filter element is disposed on the light entrance surface of the filter element (or, more precisely, on the light entrance surface of the filter element substrate 114). It is alternatively possible to have the filter layers stack disposed on the light exit surface, or to have filter layers stacks disposed on both the light entrance and exit surfaces (either of the same type to provide sharper spectral bandwidth or cutoff, or of different types to provide more complex filter characteristics, e.g., two stop-bands in a two-band notch filter).

As explained above, the entrance and exit apertures 120, 122, define apertures masks on the light entrance surface 123 and light exit surface 124 of the filter array, respectively, and are patterned opaque coatings deposited onto the boundaries between optical filter elements after assembly of the filter elements. In particular, the aperture mask includes a photoresist, or in other words is formed from the photoresist. Due to the use of a photoresist, the aperture mask can be printed directly on the light entrance or exit surfaces 123, 124 of the filter array (i.e., without an optical coating applied between the apertures and the light entrance surface or light exit surface). This advantageously eliminates the need for optical coatings between the aperture mask and the substrate, and further eliminates certain conditions required for coatings, such as temperature and stress as well as the long lift-off process in chemicals. It will also be appreciated that such an implementation will assist in the elimination of stray light and crosstalk between optical bands.

Again, the aperture mask(s) includes or is formed from a photoresist, which advantageously obviates the need to apply optical coatings to the substrate. Depending on the desired application of the filter array, the photoresist can be negative or positive. Similarly, again depending on the desired application of the filter array, the photoresist can be photo-definable or non-photo-definable (e.g., a polyimide that is not light sensitive, i.e. is not a positive photoresist and is not a negative photoresist). Suitable examples of positive photoresists capable of functioning as set forth above include, for exemplary purposes only and not for purposes of limiting the same: SK-9010, S-1813, or S-1818. Suitable examples of negative photoresists capable of functioning as set forth above include, for exemplary purposes only and not for purposes of limiting the same: AZ P4620, AZ NLof 2020, or AZ NLof 2070. Suitable examples of non-photo-definable photoresists capable of functioning as set forth above include, for exemplary purposes only and not for purposes of limiting the same: polyimides.

As will be appreciated by those skilled in the art, application of an aperture mask including a photoresist to a substrate in accordance with the present disclosure can be achieved by any suitable means. For purposes of example and not for purposes of limiting the same, the aperture mask can be applied in any desired pattern using additive manufacturing techniques, such as printing via an inkjet-type additive manufacturing printer, printing via an extrusion-type printer (i.e., a fused filament fabrication printer), printing via any other 3-D printing technique, fused deposition modeling, or any standard photolithography technique, including but not limited to contact printing, spray applications, or any other exposure or development method. A separate mask is then used to expose the photoresist to light. The photoresist can then be developed by application of a developer, which removes the undesired portion of the photoresist layer, leaving the desired portion behind as an aperture mask. In other words, the photoresist is used to form the aperture mask, rather than used as a means of forming the desired aperture mask pattern in an optical DMC coating and then being removed from the optical DMC coating.

Thus, in some embodiments an optical device comprises a multi-spectral optical filter array comprising a plurality of optical filter elements bonded together to form the multi-spectral optical filter array, and an aperture mask formed on a light entrance surface and/or on a light exit surface of the multi-spectral optical filter array wherein the aperture mask comprises a photoresist or a non-photo-definable polyimide. In some embodiments, each optical filter element comprises a filter element substrate and a filter layers stack forming an interference filter having a pass band or stop band, the filter layers stack supported by the filter element substrate. In some embodiments each optical filter element has a different pass band or stop band.

With continuing reference to FIGS. 1 and 2 and with further reference to FIG. 3, an illustrative method of manufacturing the aperture mask of a filter array is described. In an operation S1, a photoresist layer is deposited on a surface of the optical substrate, that is, on the preexisting or prefabricated optical filter array. For fabricating the entrance apertures 120, the photoresist layer is suitably deposited on the light entrance surface 123 of the filter array. For fabricating the exit apertures 124, the photoresist layer is suitably deposited on the light exit surface 124 of the filter array. In an operation S2, portions of the photoresist layer are exposed to light. In an operation S3, the photoresist layer is developed to form the aperture mask (e.g. entrance apertures 120 and/or exit apertures 122) on the surface of the optical substrate.

The apparatuses (e.g., a multi-spectral optical filter array, an optical wafer, an optical component) of the present disclosure can be manufactured by any suitable means, as will be appreciated by those skilled in the art. For example, manufacture of the filter array of FIG. 1 and FIG. 2 can include fabrication of a filter plate on a bulk substrate for each filter element 1-4. Typically, this entails disposing the substrate (e.g. a glass substrate for some visible-range designs) in a deposition system and depositing the filter layers stack by sputtering, vacuum evaporation, plasma deposition, or another technique, with the thicknesses of the constituent layers of the filter stack of each filter plate designed to provide filter characteristics of the corresponding filter type. The result of this processing is a set of filter plates, e.g. four filter plates corresponding to filter elements 1, 2, 3, and 4, for fabricating the illustrative filter array of FIG. 1 and FIG. 2. Filter elements of the desired types can then be mounted in a bonding jig and glued together at the sidewalls (e.g., slanted sidewalls for an angled array, such as that depicted in FIG. 1 and FIG. 2) using adhesive or are otherwise bonded together to form the multispectral filter array. Finally, other components, such as the entrance and/or exit apertures 120, 122 and other components (e.g., light detectors) are added to the filter array to form a complete multispectral optical system.

The present specification has been set forth with reference to exemplary embodiments. Modifications and alterations will occur to others upon reading and understanding the present specification. It is intended that the present disclosure be construed as including all such modifications and alterations insofar as they come within the scope of the appended claims or the equivalents thereof.

The invention claimed is:

1. An optical apparatus, comprising:
   a substrate having a light entrance surface and a light exit surface, wherein the substrate comprises an optical wafer; and
   an aperture mask printed on the light entrance surface of the substrate so as to provide an opening over a portion of the substrate for light to travel therethrough and between the light entrance surface and the light exit surface of the substrate,
   wherein the aperture mask includes a photoresist and does not include a dark mirror coating, and
   wherein a dark mirror coating is not present between the substrate and the aperture mask.

2. The optical apparatus of claim 1, wherein the substrate comprises a filter layers stack on the light entrance surface of the substrate, and wherein the aperture mask is arranged on the filter layers stack.

3. The optical apparatus of claim 1, wherein the substrate comprises a first optical filter element bonded together at a boundary with a second optical filter element, and wherein the aperture mask is printed directly on the boundary.

4. The optical apparatus of claim 3, wherein the substrate comprises an adhesive at the boundary between the first and second optical filter elements.

5. The optical apparatus of claim 1, wherein the photoresist is opaque.

6. The optical apparatus of claim 1, wherein the aperture mask is printed on both the light entrance surface and the light exit surface of the substrate.

7. The optical apparatus of claim 1, wherein the photoresist is photo-definable.

8. An optical apparatus comprising:
   an optical substrate having a light entrance surface and a light exit surface and comprising a filter layers stack arranged on the light entrance surface; and
   an aperture mask printed on the filter layers stack of the light entrance surface of the optical substrate to define openings for light to travel through the openings and between the light entrance surface and the light exit surface of the optical substrate, wherein the aperture mask is formed from a photoresist and is not a dark mirror coating, and wherein a dark mirror coating is not present between the optical substrate and the aperture mask.

9. The optical apparatus of claim 8, wherein the aperture mask is also arranged on the light exit surface of the optical substrate.

10. The optical apparatus of claim 8, wherein the optical substrate comprises a first optical filter element bonded together at a boundary with a second optical filter element, and wherein the aperture mask is printed directly on the boundary.

11. The optical apparatus of claim 10, wherein the optical substrate comprises an adhesive at the boundary between the first and second optical filter elements.

12. An optical device comprising:
an optical substrate having a light entrance surface and a light exit surface, wherein the optical substrate comprises a filter layers stack forming an interference filter having a pass band or stop band; and
an aperture mask formed on the light exit surface of the optical substrate, wherein openings in the aperture mask are configured to allow light to travel therethrough and between the light entrance surface and the light exit surface of the optical substrate, wherein the aperture mask comprises a photoresist or a non-photo-definable polyimide, wherein the aperture mask does not comprise a dark mirror coating, and wherein a dark mirror coating is not present between the optical substrate and the aperture mask.

13. The optical device of claim 12, wherein the aperture mask comprises a positive photoresist or a negative photoresist.

14. The optical device of claim 12, wherein the aperture mask comprises a non-photo-definable polyimide.

15. The optical device of claim 12, wherein the filter layers stack is arranged on the light entrance surface of the optical substrate.

16. The optical device of claim 12, wherein the aperture mask is also arranged on the filter layers stack, and wherein no dark mirror coating is present between the filter layers stack and the aperture mask.

17. The optical device of claim 12, wherein the aperture mask is also arranged on the light entrance surface of the optical substrate.

18. The optical device of claim 17, wherein the optical substrate comprises a first optical filter element bonded together at a boundary with a second optical filter element, and wherein the aperture mask is printed directly on the boundary.

* * * * *